United States Patent
Kameya

(10) Patent No.: US 9,401,688 B2
(45) Date of Patent: Jul. 26, 2016

(54) PASSIVE EQUALIZER

(71) Applicant: MATSUE ELMEC CORPORATION, Matsue-Shi, Shimane (JP)

(72) Inventor: Masaaki Kameya, Matsue (JP)

(73) Assignee: MATSUE ELMEC CORPORATION, Matsue-shi (JP)

( * ) Notice: Subject to any disclaimer, the term of this patent is extended or adjusted under 35 U.S.C. 154(b) by 0 days.

(21) Appl. No.: 14/422,770

(22) PCT Filed: Dec. 10, 2012

(86) PCT No.: PCT/JP2012/081906
§ 371 (c)(1),
(2) Date: Feb. 20, 2015

(87) PCT Pub. No.: WO2014/091534
PCT Pub. Date: Jun. 19, 2014

(65) Prior Publication Data
US 2015/0288341 A1    Oct. 8, 2015

(51) Int. Cl.
| | |
|---|---|
| *H04B 3/04* | (2006.01) |
| *H03H 1/02* | (2006.01) |
| *H04B 3/14* | (2006.01) |
| *H04L 25/03* | (2006.01) |
| *H03H 21/00* | (2006.01) |
| *H04B 7/005* | (2006.01) |

(52) U.S. Cl.
CPC ............. *H03H 1/02* (2013.01); *H03H 21/0001* (2013.01); *H04B 3/04* (2013.01); *H04B 3/14* (2013.01); *H04B 7/005* (2013.01); *H04L 25/03* (2013.01); *H04L 25/03878* (2013.01)

(58) Field of Classification Search
CPC ............. H04B 3/04; H04B 4/14; H01P 9/003
USPC ....................................................... 333/28 R
See application file for complete search history.

(56) References Cited

U.S. PATENT DOCUMENTS

| | | | | |
|---|---|---|---|---|
| 3,562,417 | A * | 2/1971 | Poppa .................. | H03H 7/0169 333/170 |
| 3,673,520 | A * | 6/1972 | Taylor .................... | H04B 3/147 333/169 |
| 2015/0171920 | A1* | 6/2015 | Kameya .................. | H04B 3/14 333/28 R |

FOREIGN PATENT DOCUMENTS

| | | |
|---|---|---|
| JP | 2003-229791 A | 8/2003 |
| JP | 2009-55284 A | 3/2009 |

OTHER PUBLICATIONS

International Search Report dated Mar. 12, 2013, issued in corresponding application No. PCT/JP2012/081906.

(Continued)

*Primary Examiner* — Stephen E Jones
(74) *Attorney, Agent, or Firm* — Westerman, Hattori, Daniels & Adrian, LLP

(57) ABSTRACT

A first meander line 1A is formed on one surface of a first dielectric layer 9A, with one end as a signal input position, and the other end connected to a first termination resistance 5A, and a second meander line 1C facing the first meander line 1A is formed on a surface facing the first dielectric layer 9A, and the second meander line 1C is formed, with one end positioned at the other end side of the first meander line 1A as a signal output position, and the other end connected to a second termination resistance 5C, and a first conductor line 3A is formed on the side facing the first dielectric layer 9A, with one end connected to the signal input position and the other connected to the signal output position, and a dividing section in a middle of the first conductor line 3A is connected by a first series resistance 7A.

14 Claims, 17 Drawing Sheets

(56) References Cited

OTHER PUBLICATIONS

"Construction of an integrated circuit system utilizing a communication/signal processing technique for Multiple-Valued Code-Division Multiple Access Techniques for Intra-Chip Communication", Telecommunications Advancement Foundation, 2008, pp. 603-610, Research Investigation Report No. 23.

Notification of Transmittal of Translation of the International Preliminary Report on Patentability (Form PCT/IB/338) issued in counterpart International Application No. PCT/JP2012/081906 dated Jun. 25, 2015, with Forms PCT/IB/373 and PCT/ISA/237 (5 pages).

* cited by examiner

PASSIVE EQUALIZER E

PRIOR ART

PASSIVE EQUALIZER

TECHNICAL FIELD

The present invention relates to a passive equalizer used as a waveform equalization circuit for recovering a waveform of a transmission signal degraded by a transmission loss, and particularly relates to a passive equalizer used for a transmission of an ultrafast serial signal exceeding 10 Gbit/s.

DESCRIPTION OF RELATED ART

In the transmission of the ultrafast serial signal, a pulse width of a digital transmission signal is dynamically changed by data content. Therefore, such a transmission signal has a broad frequency component. Accordingly, when the transmission loss occurs, amplitude is easily attenuated when a pulse has a narrower pulse width, that is, when a pulse has a higher frequency component.

Particularly, 1 unit interval signal (UI signal) is a minimum pulse width signal generating a single pulse of "0" or "1" separately, and has a highest frequency and is strongly influenced by the transmission loss. Therefore, a phenomenon of a small amplitude is easily generated, compared with multiple UI signal such as 2UI signal generating two successive pulses of "0" and "1", and 3UI signal generating three successive pulses of "0" and "1", and so forth.

Thus, when only the 1UI signal has a small amplitude, the following case easily occurs: the 1UI signal cannot completely rise to a predetermined level when the 1UI signal is generated separately after the same level is continued.

Such a 1UI signal that cannot completely rise, is not recognized by a receiver IC in an electronic circuit, and a bit error of the transmission signal is likely to occur.

As a method of avoiding such a problem, it is effective to adjust the amplitude of the entire transmission signal to the amplitude of the 1UI signal, and recover the attenuation of the amplitude of the 1UI signal relatively.

For such a purpose, a technique of equalizing an amplitude so that the amplitude of a low frequency signal is close to the amplitude of the 1UI signal, by inserting so-called an "equalizer" in a transmission circuit, the equalizer having a propagation characteristic such that attenuation is more increased toward a lower frequency, as a means for adjusting the amplitude of a transmission signal.

As shown in the Research investigation report "No. 23 2008, p 603" (Non-patent document 1) by Telecommunications Advancement Foundation, a passive equalizer of a high-pass filter system is proposed, in which a resistance and an impedance element having a frequency characteristic are combined. An example of such an equalization circuit is shown in FIG. 17.

Such a passive equalizer is a passive component, and is easily connected to an electronic circuit, and further can be easily constituted using commercially available discrete chip components, and therefore is supplied to the market as a product capable of responding to an ultrafast signal up to 12.5 Gbit/s.

Meanwhile, Japanese Patent Laid Open publication No. 2009-055284 (Patent document 1) teaches a passive equalizer configured to dispose differential lines so as to vertically face each other interposing a thin insulating layer. This is an application of the characteristic such that a transmission signal can easily pass through the coupling capacitance between upper and lower lines, when its frequency becomes higher.

PRIOR ART DOCUMENT

Non-Patent Document

Non-patent document 1:
"Construction of an integrated circuit system utilizing a communication/signal processing technique for Multiple-Valued Code-Division Multiple Access Techniques for Intra-Chip Communication" by Telecommunications Advancement Foundation (Research investigation report No. 23 2008, p 603)

Patent Document

Patent document 1: Japanese Patent Laid Open Publication No. 2009-055284

DISCLOSURE OF THE INVENTION

Problem to be Solved by the Invention

However, when the circuit shown in the abovementioned non-patent document 1 is constituted of the commercially-available chip components and is configured to respond to a next-generation transmission speed of 25 G to 28 Gbit/s exceeding 10 Gbit/s, there is a problem that difference in properties occurs due to the stray inductance in the electrode of the chip components, and characteristics as designed cannot be obtained, or there is a problem that a capacitance value of the capacitor is likely to be critical.

Therefore, the capacitor of a desired capacitance value cannot always be available, and even if it can be available, the following problem is likely to occur: the characteristics are not stable under great influence of the tolerance at the time of mass production purchase. Therefore, the structure using the commercially-available chip components is not suitable for the purpose of a use for a transmission speed exceeding 10 Gbit/s.

Therefore, the passive equalizer having a monolithic structure such as a multilayer ceramic structure is desired.

However, the wavelength of a transmission signal is short in the use for the transmission speed of 25 G to 28 Gbit/s, and therefore if the structure of FIG. 17 is attempted to be realized by the multilayer ceramic structure so as to be a lumped constant circuit, another problem is likely to occur.

That is, the problem that a signal is reflected or attenuated by impedance mismatch, is likely to occur unless a capacitor electrode functions as a distributed constant line and the dimension and the shape of the electrode are suitable as a transmission line such as a coplanar line and a strip line.

Conversely, in a general multilayer ceramic structure which is not specific for a chip capacitor, when priority is put on a proper dimension of the transmission line, the following problem is likely to occur: a desired capacitance value cannot be obtained, thus making it difficult to design such a passive equalizer.

Meanwhile, the structure of patent document 1 has the following problem: although the configuration is simple and a correct impedance value and a capacitor capacitance are easily obtained, the transmission signal passes through a relatively broad band similarly to a general coupling capacitor due to the function of the upper and lower line patterns interposing the insulating layer as a capacitor electrode, thus making it difficult to obtain a desired frequency characteristic such that a transmission loss is selectively reduced in the frequency near the frequency of the 1UI signal.

In addition, this structure also has the following problem: direct current (DC) is cut-off, thus significantly attenuating the signal near the direct current, and in the transmission of the ultrafast serial signal, it is difficult to pass the transmission signal of a low frequency component in which the same logic level continues for a long time, and a bit error is generated in the transmission signal including many low frequency components.

In order to solve the abovementioned problem, the present invention is provided, and an object of the present invention is to provide the passive equalizer capable of responding to a transmission of a ultrafast serial signal, and particularly to a transmission signal of 25 G to 28 Gbit/s, and capable of obtaining excellent propagation characteristic even if a large dimensional error occurs in an internal electrode size.

Means for Solving the Problem

In order to solve the abovementioned problem, there is provided a passive equalizer according to claim 1, including:

a first meander line formed on one surface of a dielectric layer, with one end as a signal input position and the other end connected to a first termination resistance;

a second meander line formed on a side facing the first meander line interposing the dielectric layer, along the first meander line so as to face the first meander line, with one end positioned at the other end side of the first meander line as a signal output position and the other end connected to a second termination resistance;

a first conductor line formed on a surface facing a formation surface of the second meander line with a space between them, with one end as the signal input position and the other end as the signal output position, and at least one portion divided in a middle; and a first series resistance connected in series so as to connect a dividing section dividing the first conductor line.

There is provided the passive equalizer according to claim 2 of the present invention, wherein the first and second meander lines have a folding cycle in such a manner that a bending line is partially overlapped on a virtual median line crossing a middle part between the signal input position and the signal output position, and the first and second meander lines are formed into the same shape so as to have a line-symmetric relation each other, with a median line as a center.

There is provided the passive equalizer according to claim 3 of the present invention, wherein the first conductor line is a meander line.

There is provided the passive equalizer according to claim 4 of the present invention, including:

a second conductor line formed on a formation surface facing the formation surface of the first conductor line with a space between them, along the first conductor line so as to face the first conductor line, with one end as the signal input position and the other end as the signal output position, and at least one portion divided in a middle; and a second series resistance connected in series so as to connect a dividing section dividing the second conductor line.

The passive equalizer according to claim 5 of the present invention, wherein the dividing section dividing the first and second conductor lines is formed at a position mutually away from the median line.

There is provided the passive equalizer according to claim 6 of the present invention, wherein the second conductor line is a meander line.

There is provided the passive equalizer according to claim of the present invention, wherein the first and second conductor lines are formed into the same shape so as to have a line-symmetric relation each other, with a median line as a center.

There is provided the passive equalizer according to claim 8 of the present invention, including:

a third meander line formed in a line-symmetric with respect to the first meander line on the formation surface of the first meander line in the dielectric layer, as a pair of differential transmission lines, with one end as an reverse phase signal input position showing a differential reverse polarity to the signal input position, and the other end connected to one end of a third termination resistance which is formed on the same formation surface as the formation surface of the first termination resistance;

a fourth meander line formed in a line-symmetric with respect to the second meander line on the formation surface of the second meander line, as a pair of differential transmission lines, with one end positioned at the other end side of the third meander line as the reverse phase signal output position, and the other end connected to one end of a fourth termination resistance which is formed on the same formation surface as the formation surface of the second termination resistance;

a third conductor line formed in a line-symmetric with respect to the first conductor line on the same formation surface as the formation surface of the first conductor line, as a pair of differential lines, with one end as the reverse phase signal input position and the other end as the reverse phase signal output position, and at least one portion divided in a middle; and a third series resistance connected in series so as to connect the dividing section dividing the third conductor line.

There is provided the passive equalizer according to claim 9 of the present invention, wherein the first and second meander lines have a folding cycle in such a manner that a bending line is partially overlapped on a virtual median line crossing a middle part between the signal input position and the signal output position, and are formed into the same shape so as to have a line-symmetric relation each other, with a median line as a center.

There is provided the passive equalizer according to claim of the present invention, wherein the first and third conductor lines are meander lines.

There is provided the passive equalizer according to claim 11 of the present invention, including:

the second conductor line formed on a surface facing the first conductor line, along the first conductor line so as to face the first conductor line, with one end as the signal input position and the other end as the signal output position, and at least one portion divided in a middle;

a second series resistance connected in series so as to connect a dividing section dividing the second conductor line;

a fourth conductor line formed in a line-symmetric with respect to the second conductor line on the same formation surface as the formation surface of the second conductor line, as a pair of differential lines, with one end as the reverse phase signal input position and the other end as the reverse phase signal output position, and at least one portion divided in a middle; and a fourth series resistance connected in series so as to connect the dividing section dividing the fourth conductor line.

There is provided the passive equalizer according to claim 12 of the present invention, wherein dividing sections dividing the first to fourth conductor lines are formed at positions away from each other from the median line.

There is provided the passive equalizer according to claim 13 of the present invention, wherein the second and fourth conductor lines are meander lines.

There is provided the passive equalizer according to claim 14 of the present invention, wherein the first and second conductor lines are formed into the same shape so as to have a line-symmetric relation each other, with a median line as a center.

Advantage of the Invention

According to the passive equalizer of claim 1 of the present invention, a signal of a high frequency passes between first and second facing meander lines with low loss and meanwhile a signal of a low frequency passes through the first conductor line and attenuated by the first series resistance, and such a passive equalizer is capable of easily functioning as an equalizer, responding to a transmission of an ultrafast serial signal, particularly responding to a transmission signal of 25 G to 28 Gbit/s, and capable of obtaining an excellent propagation characteristic even in a case that a great error occurs in the dimension of the internal electrode size.

According to the passive equalizer of claim 2 of the present invention, preferable characteristics can be easily obtained as the passive equalizer and a pattern can be shared so that a cost can be easily reduced.

According to the passive equalizer of claim 3 of the present invention, each kind of propagation characteristic can be easily adjusted.

According to the passive equalizer of claim 4 of the present invention, propagation characteristic of a signal of a low frequency can be easily adjusted.

According to the passive equalizer of claim 5 of the present invention, propagation characteristic of a signal of a high frequency can be easily adjusted.

According to the passive equalizer of claim 6 of the present invention, the second conductor line is constituted of a meander line, and therefore each kind of propagation characteristic can be easily adjusted.

According to the passive equalizer of claim 7 of the present invention, each kind of propagation characteristic can be easily adjusted, and therefore a circuit pattern can be shared so that the cost can be reduced.

The passive equalizer of claim 8 of the present invention functions as an equalizer for a differential signal.

The passive equalizer of claim 9 of the present invention is capable of easily obtaining a further preferable characteristic as an equalizer for the differential signal, and the circuit pattern can be shared so that the cost can be reduced.

According to the passive equalizer of claim 10 of the present invention, the first and third conductor lines are constituted as meander lines, and therefore each kind of propagation characteristic of the differential signal can be easily adjusted.

According to the passive equalizer of claim 11 of the present invention, propagation characteristic of the differential signal of a low frequency can be easily adjusted.

According to the passive equalizer of claim 12 of the present invention, propagation characteristic of the differential signal of a high frequency can be easily adjusted.

According to the passive equalizer of claim 13 of the present invention, the second and fourth conductor lines are constituted as meander lines, and therefore each kind of propagation characteristic of the differential signal can be easily adjusted.

According to the passive equalizer of claim 14 of the present invention, each kind of propagation characteristic of the differential signal can be easily adjusted, and a circuit pattern can be shared so that the cost can be reduced.

DETAILED DESCRIPTION OF THE INVENTION

Embodiments of the present invention will be described hereafter, with reference to the drawings.

Figure 1:
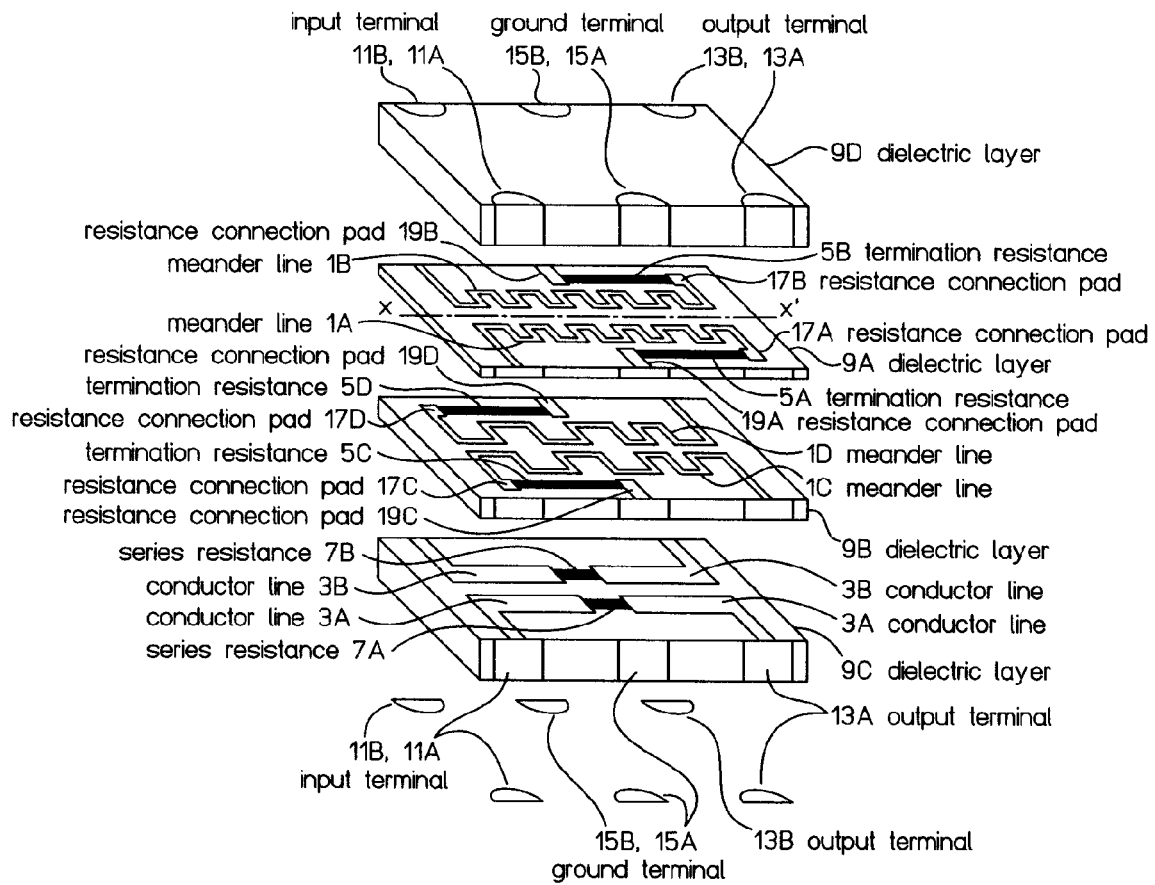
FIG. 1 is an exploded perspective view showing a passive equalizer according to an embodiment of the present invention.

FIG. 1 is an exploded perspective view showing the structure of a passive equalizer E of the present invention, in the form of a differential transmission line for example.

In FIG. 1, each pair of meander lines (first and third meander lines) 1A and 1B, termination resistances (first and third termination resistances) 5A and 5B, and resistance connection pads 17A, 17B, 19A, and 19B are formed on one surface (upper surface in FIG. 1) of a rectangular plate-like dielectric layer (first dielectric layer) 9A.

A pair of meander lines 1A and 1B are formed in a shape folded multiple times into a rectangular shape, between short sides that face each other in a longitudinal direction of the dielectric layer 9A, and the meander lines 1A and 1B are formed, with a virtual line x-x' as a center, which is the line passing through an intermediate position between the short sides so as to equally divide the dielectric layer 9A into two parts.

One end of the meander line 1A is connected to an input terminal 11A described later to form a signal input position, and one end of the meander line 1B is connected to an input terminal 11B described later to form a signal input position.

The other end of the meander line 1A is connected to a resistance connection pad 17A formed near the longitudinal short side of the dielectric layer 9A, and the other end of the meander line 1B is connected to a resistance connection pad 17B formed near the same short side.

One end of a strip-shaped termination resistance 5A is connected to the resistance connection pad 17A, and the other end of the termination resistance 5A is connected to a resistance connection pad 19A which is formed on a long side intermediate position along the longitudinal direction of the dielectric layer 9A.

One end of a strip-shaped termination resistance 5B which is similar to the termination resistance 5A is connected to the resistance connection pad 17B, and the other end of the termination resistance 5B is connected to a resistance connection pad 19B which is formed on the long side intermediate position along the longitudinal direction of the dielectric layer 9A.

The resistance connection pad 19A is connected to a ground terminal 15A described later, and the resistance connection pad 19B is connected to a ground terminal 15B described later.

The termination resistances 5A and 5B are formed respectively by a print resistive film for example, so as to be folded-back from the other end of the meander lines 1A and 1B, along near the long side of the dielectric layer 9A. A resistance value is not stable if an area overlapping on the conductors such as meander lines 1A and 1B is small. Therefore, each of the termination resistances 5A and 5B is preferably connected via such connection pads 17A, 17B, 19A, and 19B.

The meander lines 1A and 1B, termination resistances 5A and 5B, input terminals 11A and 11B, ground terminals 15A and 15B, resistance connection pads 17A and 17B, and resistance connection pads 19A and 19B are formed so as to be arranged symmetrically, with the virtual line x-x' as a center, thereby forming a pair of the differential transmission lines.

A dielectric layer (third dielectric layer) 9B made of the same material and having the same shape as the dielectric layer 9A, is disposed so as to be laminated on a facing surface (lower surface in the figure) of the dielectric layer 9A.

Each pair of meander lines (second and fourth meander lines) 1C and 1D, termination resistances (second and fourth termination resistances) 5C and 5D, and resistance connection pads 17C, 17D, 19C, and 19D are formed on one surface (upper surface in FIG. 1) of the dielectric layer 9B.

A pair of meander lines 1C and 1D are formed in a shape folded multiple times into a rectangular shape, between short sides that face each other in a longitudinal direction of the dielectric layer 9B, wherein the meander line 1C and the meander line 1A are faced each other and the meander line 1D and the meander line 1B are faced each other in nearly isometric, interposing the dielectric layer 9A.

One end of the meander line 1C is connected to an output terminal 13A described later positioned at the other end side of the first meander line 1A to form a signal output position. Similarly, one end of the meander line 1D is connected to an output terminal 13B described later.

The other end of the meander line 1C is connected to a resistance connection pad 17C, and the other end of the meander line 1D is connected to a resistance connection pad 17D.

One end of a strip-shaped termination resistance 5C is connected to the resistance connection pad 17C, and one end of a strip-shaped termination resistance 5D is connected to the resistance connection pad 17D.

The other end of the termination resistance 5C is connected to a resistance connection pad 19C which is formed on one long side intermediate position along the longitudinal direction of the dielectric layer 9B. The other end of the termination resistance 5D is connected to a resistance connection pad 19D which is formed on the other long side intermediate position of the dielectric layer 9B.

The termination resistances 5C and 5D are respectively formed along near the long side of the dielectric layer 9B from the ends of the meander lines 1C and 1D. Resistance connection pads 19C and 19D are connected to the ground terminals 15A and 15B.

The meander lines 1C and 1D, termination resistances 5C and 5D, resistance connection pads 17C and 17D, and resistance connection pads 19C and 19D are also formed so as to be arranged in a line-symmetric pattern, with a virtual line x-x' as a center, thus constituting a pair of the differential transmission line.

There is no necessity for making a coincidence between a folding cycle (fold-back pitch) of the meander lines 1A and 1B, and the folding cycle (fold-back pitch) of the meander lines 1C and 1D. Further, there is no necessity for making a uniform folding cycle (fold-back pitch) in the individual meander line.

A dielectric layer (second dielectric layer) 9C made of the same material and having the same shape as the dielectric layer 9B is disposed so as to be laminated under the dielectric layer 9B.

Each pair of conductor lines (first and third conductor lines) 3A and 3B, series resistances (first and third series resistances) 7A and 7B, are formed on one surface (upper surface in FIG. 1) of the dielectric layer 9C.

Conductor lines 3A and 3B are formed in the longitudinal direction of the dielectric layer 9C so as to face the meander lines 1C and 1D interposing the dielectric layer 9B. One end of the conductor line 3A is connected to the input terminal 11A, and the other end thereof is connected to the output terminal 13A. Also, one end of the conductor line 3B is connected to the input terminal 11B, and the other end thereof is connected to the output terminal 13B.

Conductor lines 3A and 3B are divided so as to be separated at an arbitrary position in the middle, and a series resistance 7A is connected in series so as to connect the divided conductor lines 3A, and a series resistance 7B is connected in series so as to connect the divided conductor lines 3B.

Thus, a low frequency signal including a direct current, transmits through this route via the series resistances 7A and 7B, thereby attenuating a DC signal.

A dielectric layer (fourth dielectric layer) 9D made of the same material and having the same shape as the dielectric layer 9A, is disposed above the dielectric layer 9A so as to be laminated thereon.

The dielectric layer 9D has a thickness thicker than other dielectric layers 9A and 9B as a cover layer, and input terminals 11A and 11B, and output terminals 13A and 13B are formed on corresponding both long sides along the longitudinal direction.

Ground terminals 15A and 15B are formed on both long sides, between input terminals 11A, 11B, and output terminals 13A and 13B.

FIG. 1 shows each constituent element in an exploded and perspective state, wherein one ends of the abovementioned meander lines 1A and 1B are connected to the input terminals 11A and 11B, and one ends of the abovementioned meander lines 1C and 1D are connected to the output terminal 13A and 13B, and the other ends of the termination resistances 5A, 5B, 5C, and 5D are connected to the ground terminals 15A and 15B.

When a passive equalizer E of the present invention is mounted on electronic equipment, the ground terminals 15A and 15B may usually be grounded to a power ground of a circuit. However, a signal line is sometimes connected to an external voltage line via a pull-up resistance so that amplitude center potential of the signal is fixed to a threshold value of IC, depending on a circuit configuration.

In order to achieve the abovementioned object, the ground terminals 15A and 15B may be connected to the external voltage line. Thus, the pull-up resistance can be omitted.

The dielectric layer 9A is formed to be thinnest so that it is thinner than other dielectric layers 9B, 9C, and 9D, thereby increasing an electromagnetic coupling between meander lines 1A and 1C, and between meander lines 1B and 1D.

The abovementioned dielectric layer 9C also has a role of the cover layer, and therefore it is thicker than the dielectric layers 9A and 9B which are intermediate layers.

The abovementioned equalizer E having a pair of the differential transmission lines, is manufactured by a lamination ceramic process as described below for example.

That is, each conductor pattern is formed on each surface (upper surface in FIG. 1) of the dielectric layers 9A to 9C in a green sheet state by printing such as silver paste or silver-palladium paste, and each resistance is formed by printing such as resistance paste, and thereafter the dielectric layers 9A to 9C are superimposed on each other and the dielectric layer 9D is superimposed on the dielectric layer 9A so as to be integrally formed by laminating press, which are then cut into an individual size and co-fired.

Thereafter, input electrodes 11A and 11B, output electrodes 13A and 13B, and ground electrodes 15A and 15B are formed, connected, and completed as a chip component by coating a product side face, a lower surface pad position, and an upper surface pad position, with silver paste or silver-palladium paste, which are then calcined again.

Figure 2:
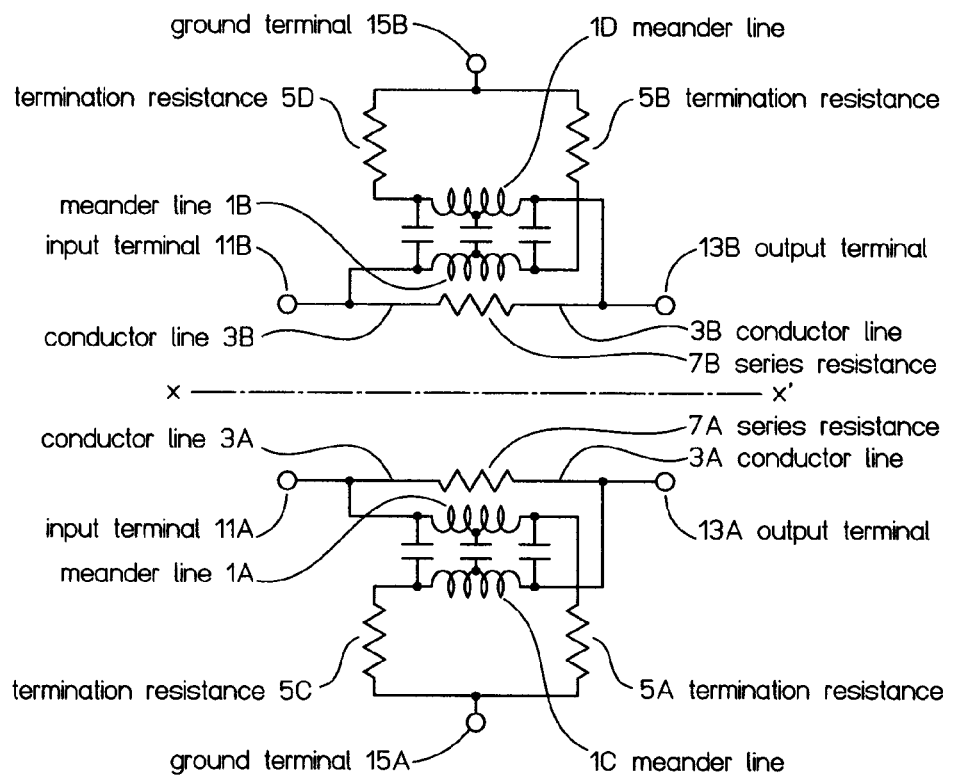
FIG. 2 is an equivalent circuit of the passive equalizer of FIG. 1.

FIG. 2 is an equivalent circuit of the structure of FIG. 1. In the structure of the present invention, an LC series resonant circuit is constituted between upper and lower facing meander lines 1A and 1C, and between upper and lower facing meander lines 1B and 1D, and only resistance is appeared to be connected from the low frequency signal including a direct current (DC), so that a π-type attenuator is constituted by such a resonant circuit.

The abovementioned LC series resonant circuits are respectively connected in parallel to the series resistances 7A and 7B, and impedance at resonance frequency is minimized. Therefore, such a resonance frequency signal passes through the LC series resonant circuit with a low loss, by bypassing the series resistances 7A and 7B. That is, by setting the frequency of the 1UI signal so as to be the resonance frequency, only the signal of this frequency can be transmitted with a low loss, and a signal of other frequency is attenuated via the series resistances 7A and 7B.

Based on the abovementioned consideration on the equivalent circuit, the equalizer E is configured so that when a ultrafast digital differential signal is applied to the input electrodes 11A and 11B and outputted from the output electrodes 13A and 13B as a transmission signal, the signal of a high frequency passes through the facing meander lines 1A and 1C, and the facing meander lines 1B and 1D, by electromagnetic coupling between them.

Meanwhile, a signal of a low frequency passes through conductor lines 3A and 3B, which is then attenuated by the series resistances 7A and 7B inserted into the conductor lines 3A and 3B, thus obtaining a function as an equalizer. In addition, ground destinations of the termination resistances 5A, 5B, 5C, and 5D can be connected to a desired position such as a ground or a power supply line.

Figure 3:
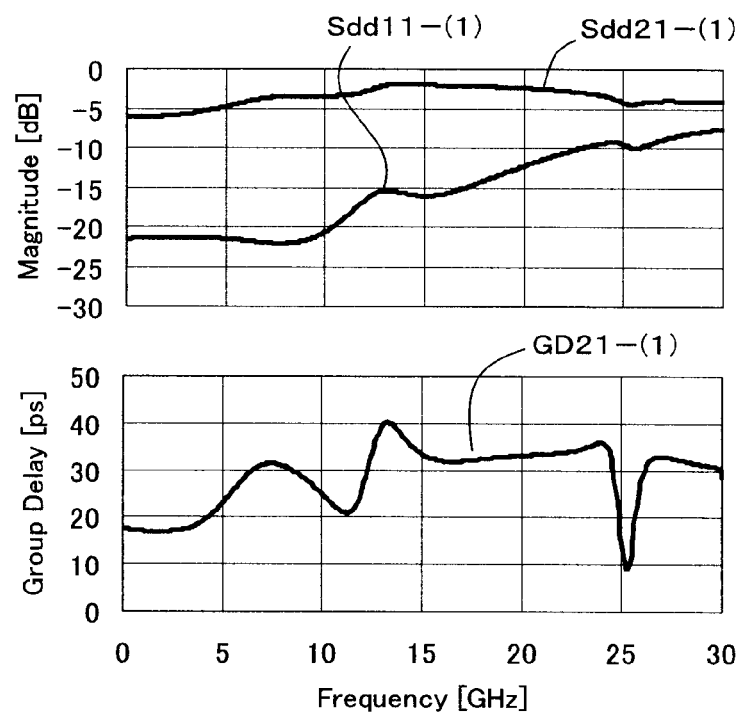
FIG. 3 is a frequency characteristic of the passive equalizer of FIG. 1.

In the equalizer E with such a structure, the following structure is considered: the ultrafast digital differential signal is applied to the input electrodes 11A and 11B and outputted from the output electrodes 13A and 13B as a transmission signal. FIG. 3 shows the frequency characteristic obtained by electromagnetic field simulation.

In FIG. 3, Sdd11-(1) indicates a reflection characteristic of the differential signal, Sdd21-(1) indicates a transmission characteristic of the differential signal, and GD21-(1) indicates a group delay characteristic of a differential transmission signal. According to FIG. 3, although a slight irregularity is observed in the group delay characteristic, the propagation characteristic shows a minimal loss at around 14 GHz.

Meanwhile, about 6 dB loss is observed near the direct current (DC), and minimal characteristic of the equalizer is obtained, for functioning as an equalizer for the transmission speed of 25 G to 28 Gbit/s. Reflection characteristic Sdd11-(1) is also suppressed to −15 dB or less up to 17 GHz, and excellent impedance matching is obtained.

Therefore, whether or not waveform amplitude can be equalized, is confirmed by circuit simulation using the equalizer having the abovementioned characteristic.

Figure 4:
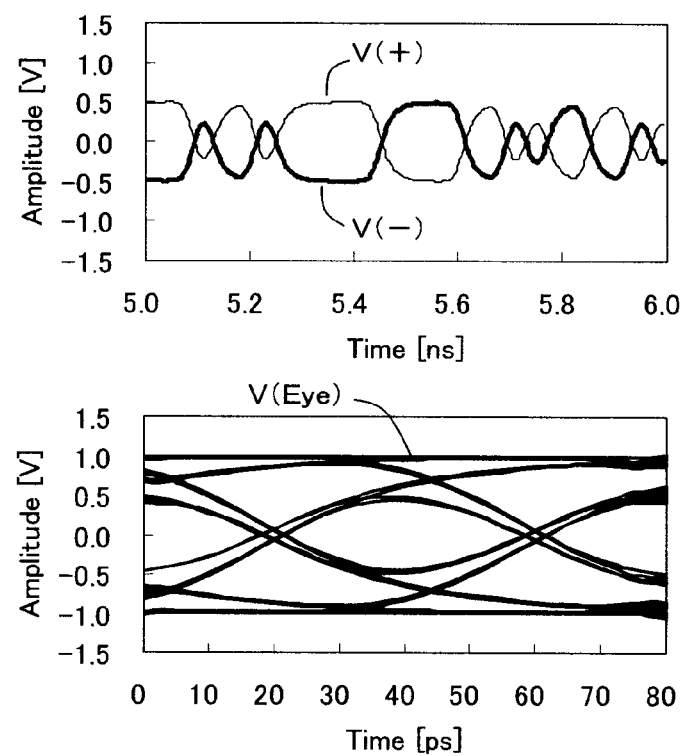
FIG. 4 is a pulse waveform chart under influence of a transmission loss inputted in the passive equalizer of FIG. 1.

FIG. 4 shows a positive-phase pulse waveform V (+) of 25 Gbit/s differential signal, a negative-phase pulse waveform V(−), and differential eye pattern V (Eye) in which the amplitude of only the 1UI signal is attenuated due to transmission loss. Thus, not only difference of amplitude, but also jitter is generated due to spread rising/falling edge.

Figure 5:
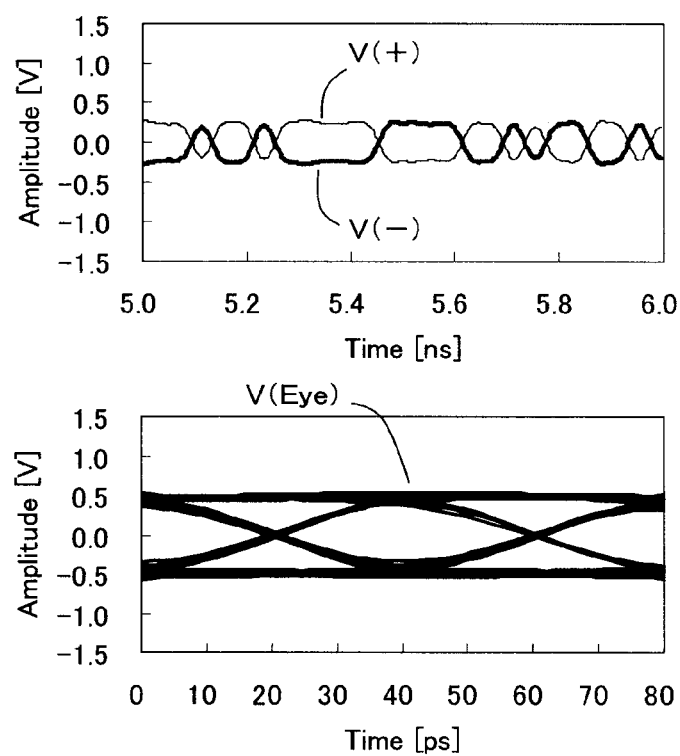
FIG. 5 is a pulse waveform chart of the passive equalizer of FIG. 1.

FIG. 5 shows an output waveform observed when such a waveform signal is transmitted the equalizer having the characteristic of FIG. 3, wherein although overall amplitude is attenuated, the jitter of the rising/falling edge is removed with disappearance of the difference of amplitude.

Thus, the passive equalizer E shown in FIG. 1 shows that it sufficiently functions as an equalizer by having the characteristic of FIG. 3, even if there is a slight irregularity observed in the group delay characteristic.

Figure 6:
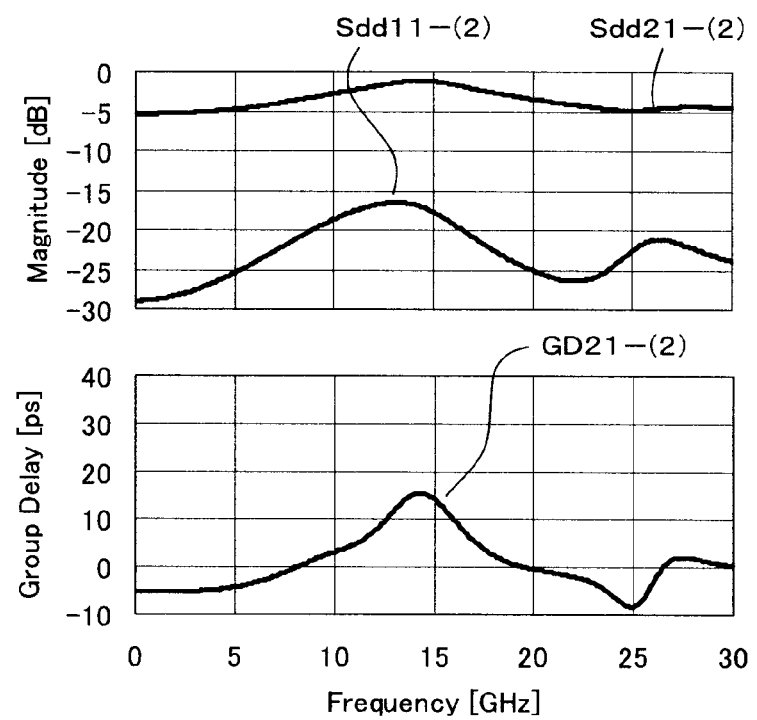
FIG. 6 is a frequency characteristic of the equivalent circuit of FIG. 5.

Such a frequency characteristic of the circuit is obtained by circuit simulation applied to the equivalent circuit of FIG. 2, as shown in FIG. 6.

In FIG. 6, each label shows the same meaning as the case of FIG. 3, and shows a similar characteristic as FIG. 3. Group delay characteristic GD21-(2) is indicated by a smaller value than that of FIG. 3. This is because the group delay characteristic is a precise value without a propagation delay time caused by terminal or a substrate land, etc.

In addition, when the characteristic of FIG. 6 is derived, the LC series resonance circuit section in the abovementioned equivalent circuit of FIG. 2, is configured so that upper and lower inductor values are equal, and all capacitor values are set to be uniform, with a tap taken out from the center.

Thus, in the equivalent circuit of FIG. 2, the LC series resonance circuit section has a balanced structure. Therefore, it can be considered that the following characteristic can be obtained: the resonance frequency is hardly dispersed, and there is no irregularity in the transmission characteristic Sdd21-(2) and the group delay characteristic GD21-(2).

Therefore, in an actual structure, it is expected that more excellent characteristic than the structure of FIG. 1 can be obtained by forming the upper and lower facing meander lines in the balanced structure.

Figure 7:
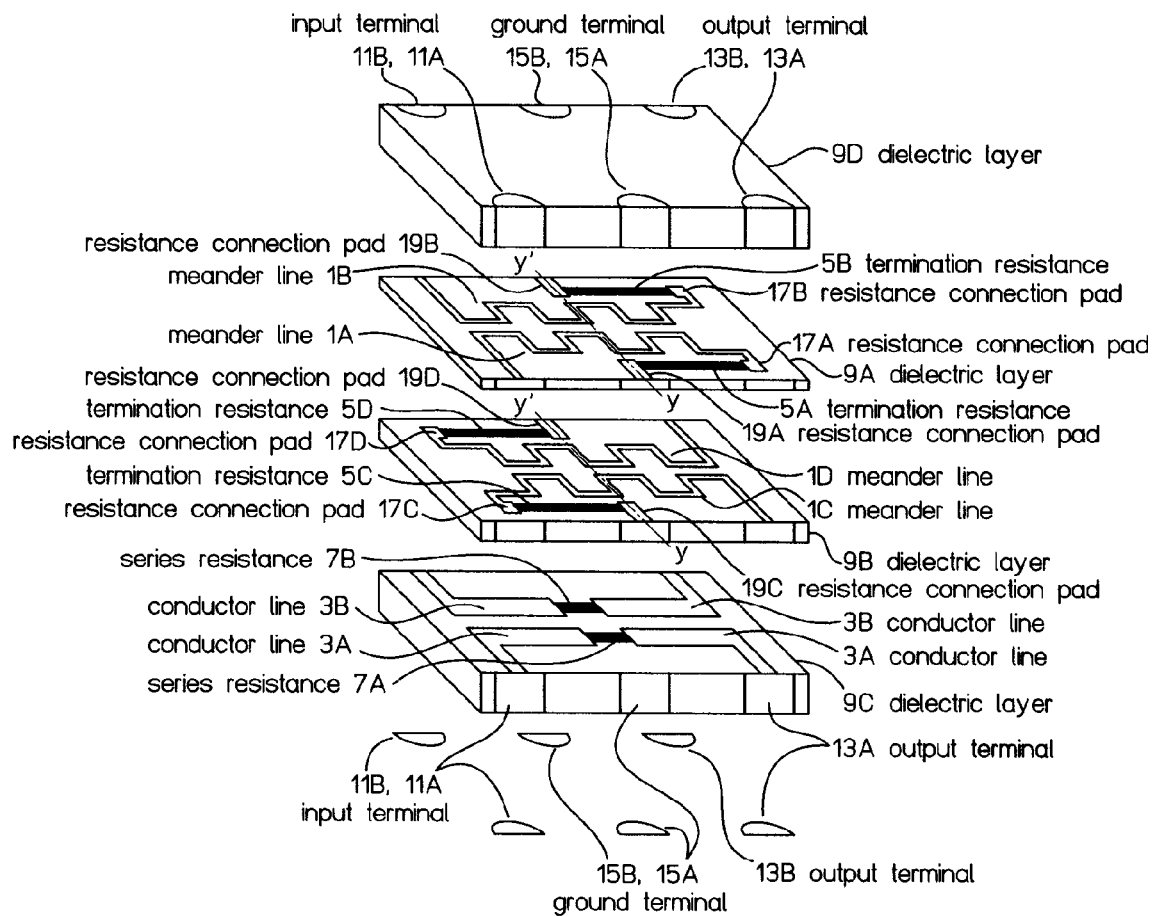
FIG. 7 is an exploded perspective view showing the passive equalizer according to another embodiment of the present invention.

FIG. 7 is an exploded perspective view showing another structure of the passive equalizer E according to the present invention, wherein upper and lower facing meander lines are balanced.

In FIG. 7, meander lines 1C and 1A, and meander lines 1D and 1B have a line-symmetric pattern (mirror image), with median line y-y' as a center, wherein the median line y-y' is formed crossing the meander lines 1A and 1B in the intermediate position between input terminals (signal input positions) 11A, 11B, and output terminals (signal output positions) 13A, 13B.

Further, the folding-back cycle of the meander lines 1A and 1C is set to be uniform excluding a connection lead-out line of the end portion, so that the line at a folding-corner part is overlapped on the median line y-y' in both meander lines 1A and 1C. That is, in both meander lines 1A and 1C, the folding cycle is overlapped not in the same phase, but in opposed phases.

With such a structure, a pair of the differential lines are formed and therefore meander lines 1A and 1B, and meander lines 1C and 1D are symmetric, and meander lines 1C and 1A, and meander lines 1D and 1B have a line-symmetric relation each other with median line y-y' as a center, and folding-back cycle is established, which is overlapped in the opposed phases. The other structure is similar to FIG. 1.

In addition, in the case of the line-symmetric patterns, one print mask for forming conductors such as meander lines, etc., can be shared by rotation of 180 degrees during pattern printing, so that a mask cost can be saved.

Figure 8:
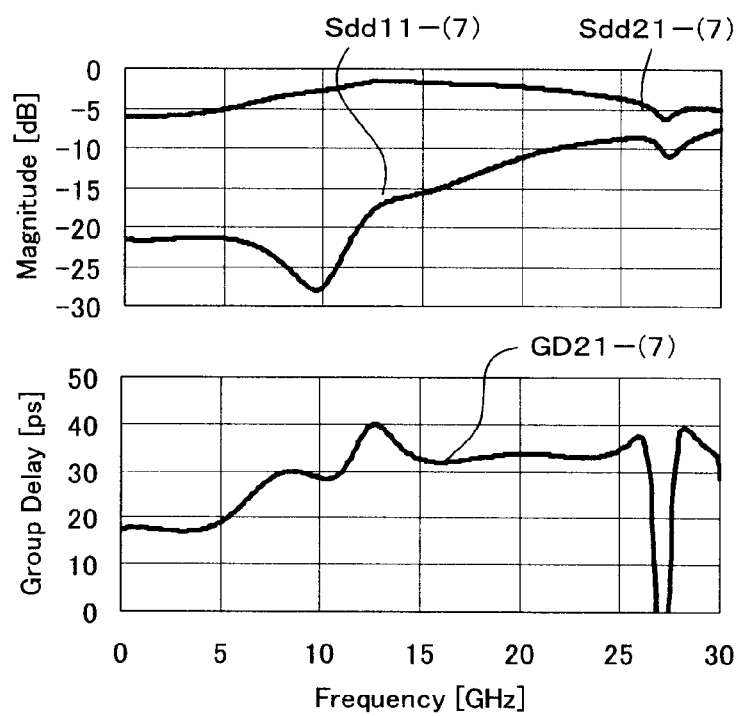
FIG. 8 is a frequency characteristic of the passive equalizer of FIG. 7.

FIG. 8 shows the frequency characteristic of the equalizer E shown in FIG. 7. Each label shows the same meaning as the case of FIG. 3.

In FIG. 8, Sdd11-(7) indicates the reflection characteristic of the differential signal, Sdd21-(7) indicates the transmission characteristic of the differential signal, and GD21-(7) indicates the group delay characteristic of the differential transmission signal.

FIG. 8 shows that the irregularity of the characteristic is reduced, compared with FIG. 3. Accordingly, although not shown, an eye pattern improvement effect equal to or greater than the effect of FIG. 5 can be realized.

Although the shapes of the meander lines 1A to 1D are significantly different between FIG. 7 and FIG. 1, a similar characteristic can be obtained in both of them. Therefore, it can be said that there is a large tolerance in the shapes of the meander lines 1A to 1D for obtaining a desired characteristic.

Figure 17:
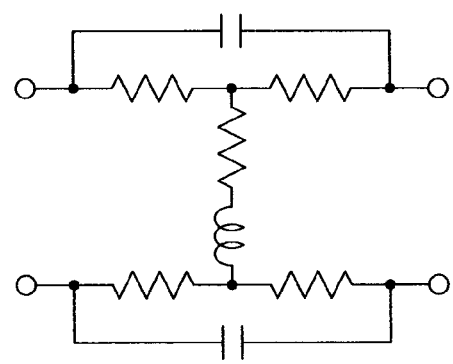
FIG. 17 is an equivalent circuit of a conventional passive equalizer.

Therefore, according to the passive equalizer E of the present invention, the characteristic is more easily stabilized than a case that the circuit of FIG. 17 is constituted by a discrete chip component.

Figure 9:
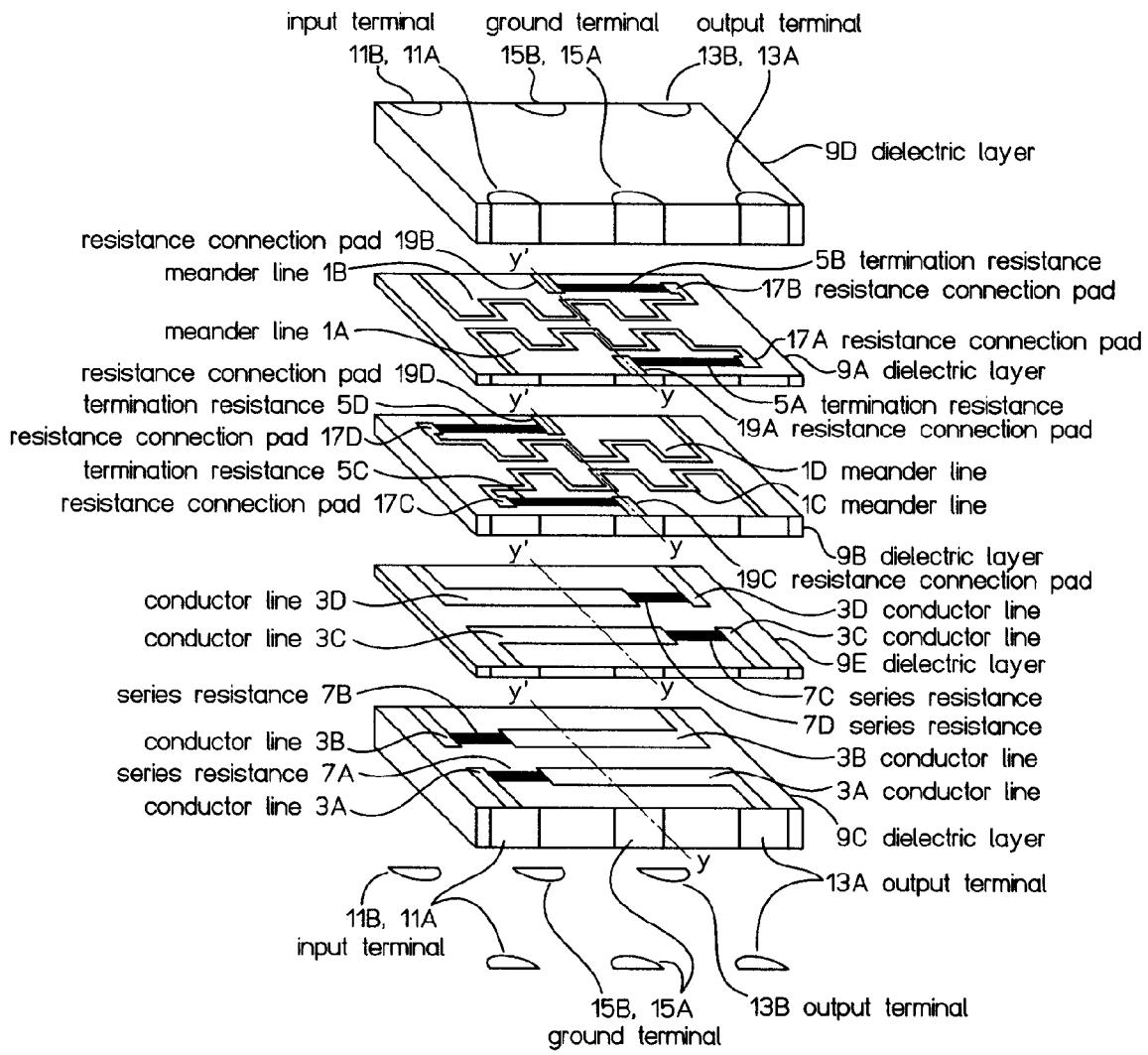
FIG. 9 is an exploded perspective view showing a passive equalizer according to another embodiment of the present invention.

FIG. 9 is an exploded perspective view showing another structure of the passive equalizer E of the present invention, wherein the conductor line for passing a low frequency signal, is formed in a two-layer structure.

In FIG. 9, a new dielectric layer (fifth dielectric layer) 9E is further inserted between the dielectric layers 9B and 9C, from the structure of FIG. 7.

Conductor lines (second and fourth conductor lines) 3C and 3D and series resistances (second and fourth series resistances) 7C and 7D are formed on one surface (upper surface in FIG. 9) of the dielectric layer 9E so as to have a relation equivalent to the line-symmetric relation of the conductor lines 3A and 3B and series resistances 7A and 7B on the dielectric layer 9C, with median line y-y' as a center.

In addition, series resistances 7A and 7B are connected to the conductor lines 3A and 3B at a position closer to the input terminals 11A and 11B from the median line y-y', and series resistances 7C and 7D are connected to the conductor lines 3C and 3D at a position closer to the output terminals 13A and 13B from the median line y-y'.

As a result, a section where conductor lines 3A and 3C are faced each other between the series resistances 7A and 7C, and a section where conductor lines 3B and 3D are faced each other between the series resistances 7B and 7D, constitute a parallel-plate capacitor, and a high frequency signal can bypass the series resistances 7A to 7D by passing through the parallel-plate capacitor.

Thus, paths of the meander lines 1A to 1D and the path of the parallel-plate capacitor are used together as the path of the high frequency signal, thus making it possible to further reduce the loss of the high frequency signal. The other structure is the same as the structure of FIG. 7.

Here, although the conductor lines 3A and 3B, and the series resistances 7A and 7B are not necessarily required to be symmetric, the conductor lines 3C and 3D, and the series resistances 7C and 7D can share a printing mask pattern if they have the line-symmetric relation each other, thus making it possible to reduce the cost required for the printing mask.

Further, the series resistances 7A and 7B, and the series resistances 7C and 7D are not necessarily required to be in a positional relation of separating from each other. However, for example when they are overlapped on each other at the same position on the median line y-y', it is difficult for the conductor lines 3A to 3B to form a bypassing path for a high frequency wave, and therefore reduction of the loss of the high frequency signal cannot be expected.

Therefore, dividing sections dividing the conductor lines 3A to 3D are preferably formed at a position mutually away from the median line y-y'.

Nevertheless, a total value of the series resistances is adjusted by changing a dimension of a resistance film or changing a resistivity of a resistance paste between the series resistances 7A and 7B, and between the series resistances 7C and 7D for example, and attenuation of a low frequency signal including a direct current (DC) can be controlled with high precision.

Figure 10:
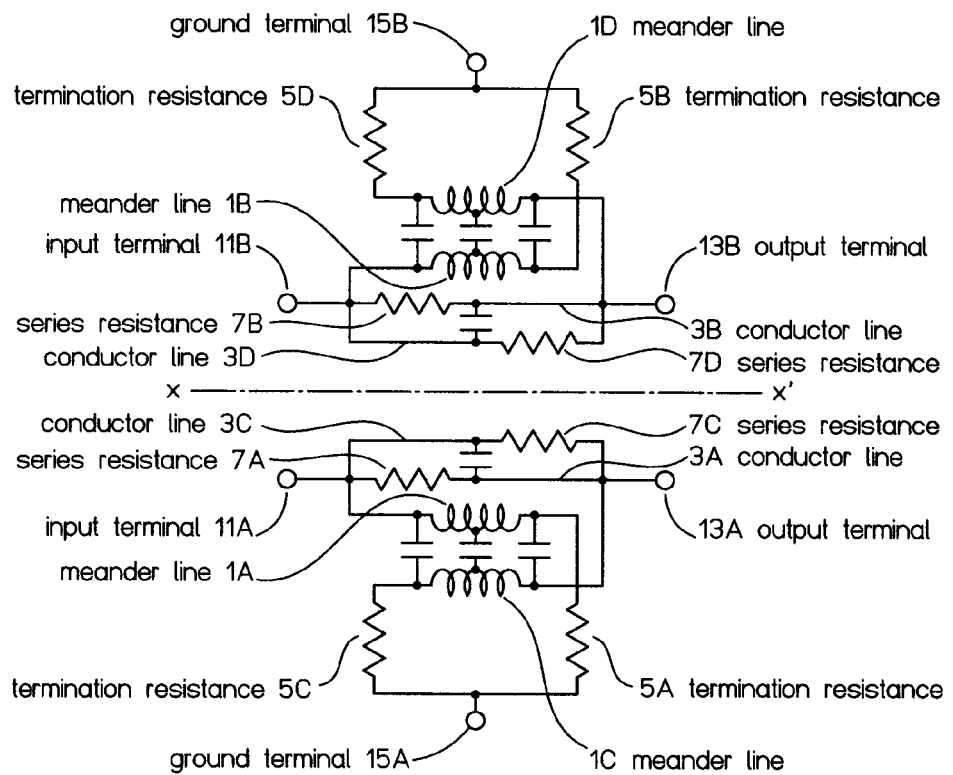
FIG. 10 is an equivalent circuit of the passive equalizer of FIG. 9.

FIG. 10 shows an equivalent circuit having the structure of FIG. 9, and shows a structure in which capacitors formed between the facing conductor lines 3A and 3C, and between the facing conductor lines 3B and 3D, are connected in parallel to the series resistances 7A to 7D on the equivalent circuit, and shows that the high frequency signal can bypass the series resistances 7A to 7D.

Figure 11:
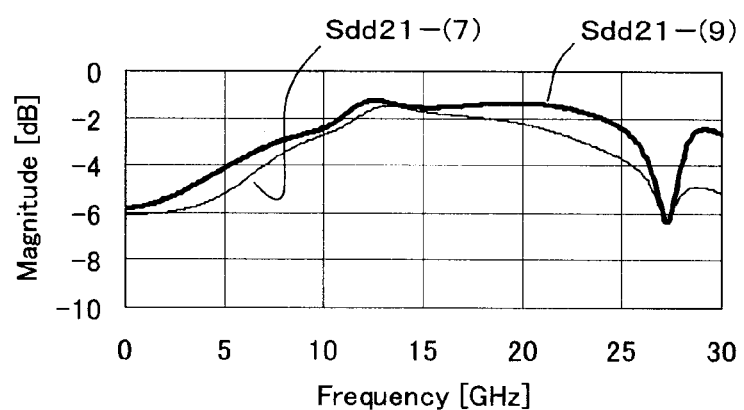
FIG. 11 is a frequency characteristic of the passive equalizer of FIG. 9.

FIG. 11 is a frequency characteristic of the equalizer E shown in FIG. 9, wherein only the differential transmission characteristic Sdd21 is shown for comparison with the characteristic of FIG. 8.

In the differential transmission characteristic Sdd21-(9) of the structure of FIG. 9, a high frequency loss is slightly reduced, compared with the differential transmission characteristic Sdd21-(7) of the structure of FIG. 7.

Figure 12:
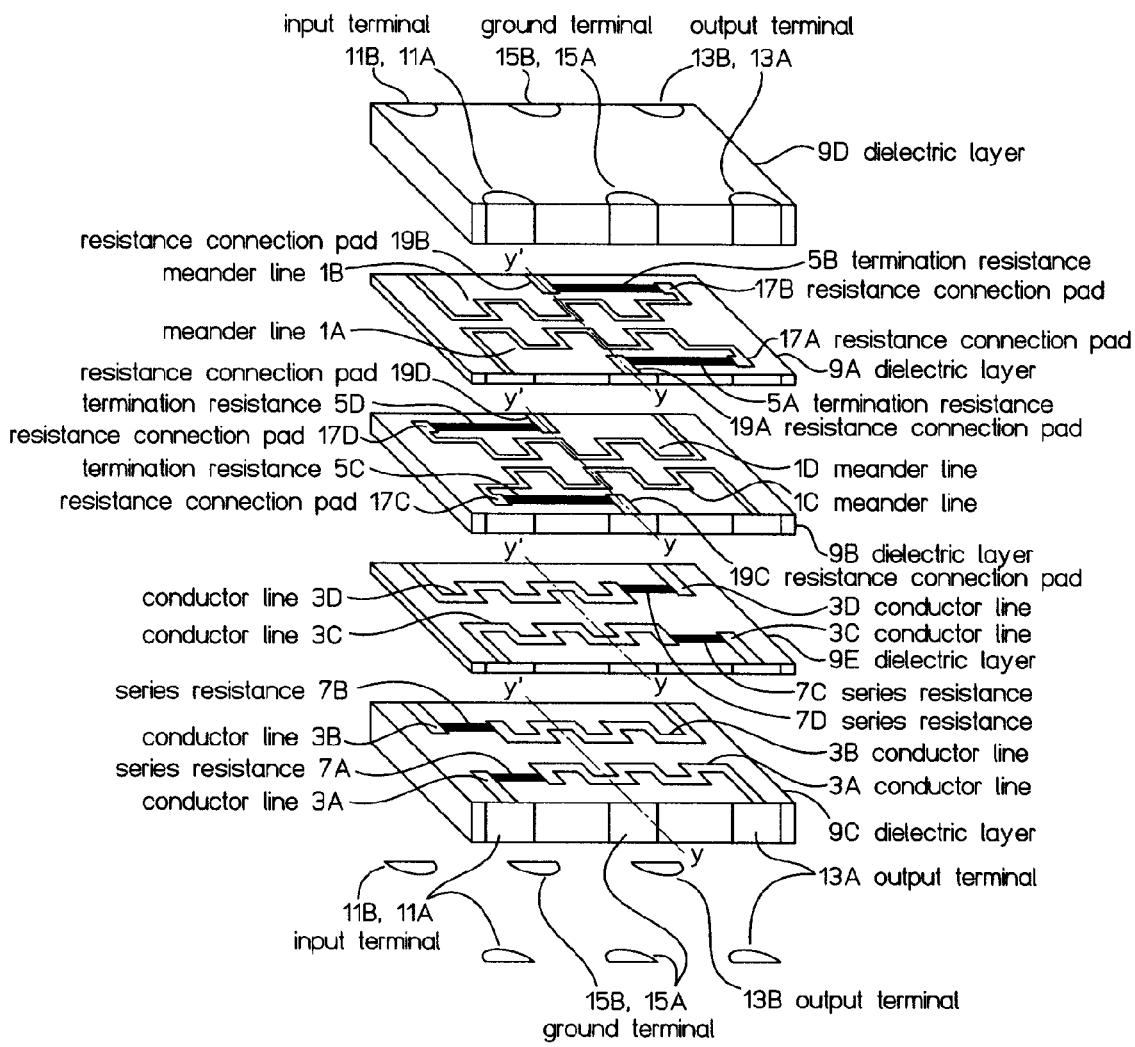
FIG. 12 is an exploded perspective view showing a passive equalizer according to another embodiment of the present invention.

FIG. 12 is an exploded perspective view showing another structure of the passive equalizer E according to the present invention, wherein a conductor line for passing a low frequency signal is also formed in a meander state.

In FIG. 12, conductor lines 3A to 3D are set in a meander state, and the conductor lines 3A and 3B, and the conductor lines 3C and 3D have a line-symmetric relation each other with median line y-y' as a center. However, they are faced each other at the folding-back cycle in the same phase, unlike the meander lines 1A to 1D. The other structure is the same as the structure of FIG. 9.

Figure 13:
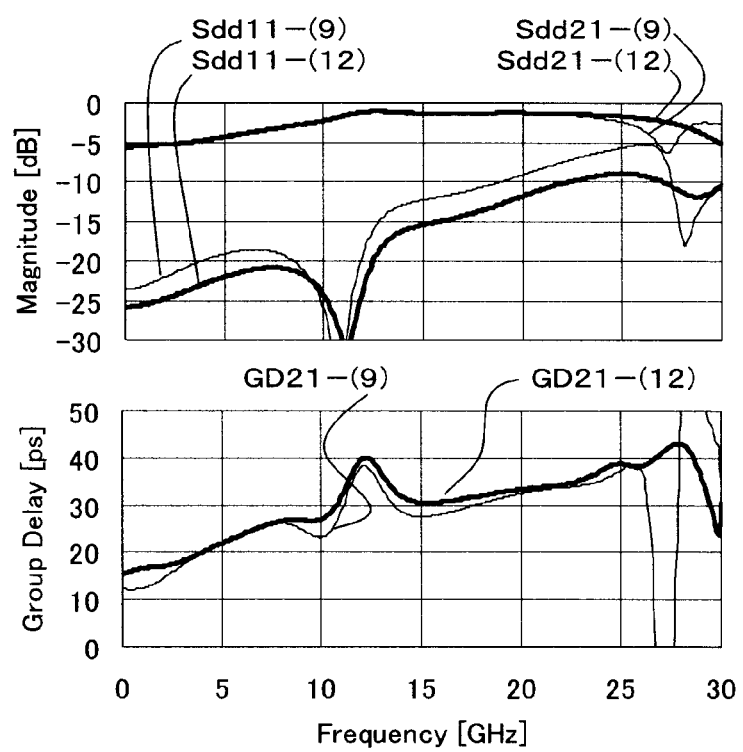
FIG. 13 is a frequency characteristic of the passive equalizer of FIG. 12.

FIG. 13 shows a frequency characteristic of the equalizer E shown in FIG. 12. In FIG. 13, Sdd11-(12) shows a differential reflection characteristic in the structure of FIG. 12, Sdd21-(12) shows the differential transmission characteristic in the structure of FIG. 12, and GD21-(12) shows a differential group delay characteristic in the structure of FIG. 12.

Further, although not shown in FIG. 11, differential reflection characteristic Sdd11-(9) and differential group delay characteristic GD21-(9) in the structure of FIG. 9 are also shown for comparison.

In the structure of FIG. 12, it is found that differential reflection characteristic Sdd11-(12) is improved and the irregularity is more reduced than the differential group delay characteristic GD21-(12).

In addition, although not shown, similar characteristic can be obtained even in a case that conductor lines 3A and 3B and conductor lines 3C and 3D are faced each other at a folding cycle in the opposed phase.

The passive equalizer E has been described above, which has a structure in which a line-symmetric circuit is independently disposed, with a virtual line (x-x' in FIG. 1) as a center for dividing the differential line into two parts, while constituting a pair of the differential lines, to thereby form the differential transmission line.

This structure is the structure that can be used even in a single-ended use of removing or non-using either one of the two parts divided by the virtual line x-x' which divides the differential line. And a ground terminal is required instead of this advantage convenience.

On the other hand, a conventional passive equalizer shown in FIG. 17 does not have ground terminals. And originally, a differential signal transmission can be transmitted without common grounds. Therefore, a component requiring a connection of the ground terminals cannot be mounted on a circuit portion having no common grounds, and this is not preferable.

Therefore, the passive equalizer E without ground terminals capable of avoiding such a problem, is shown for example.

Figure 14:
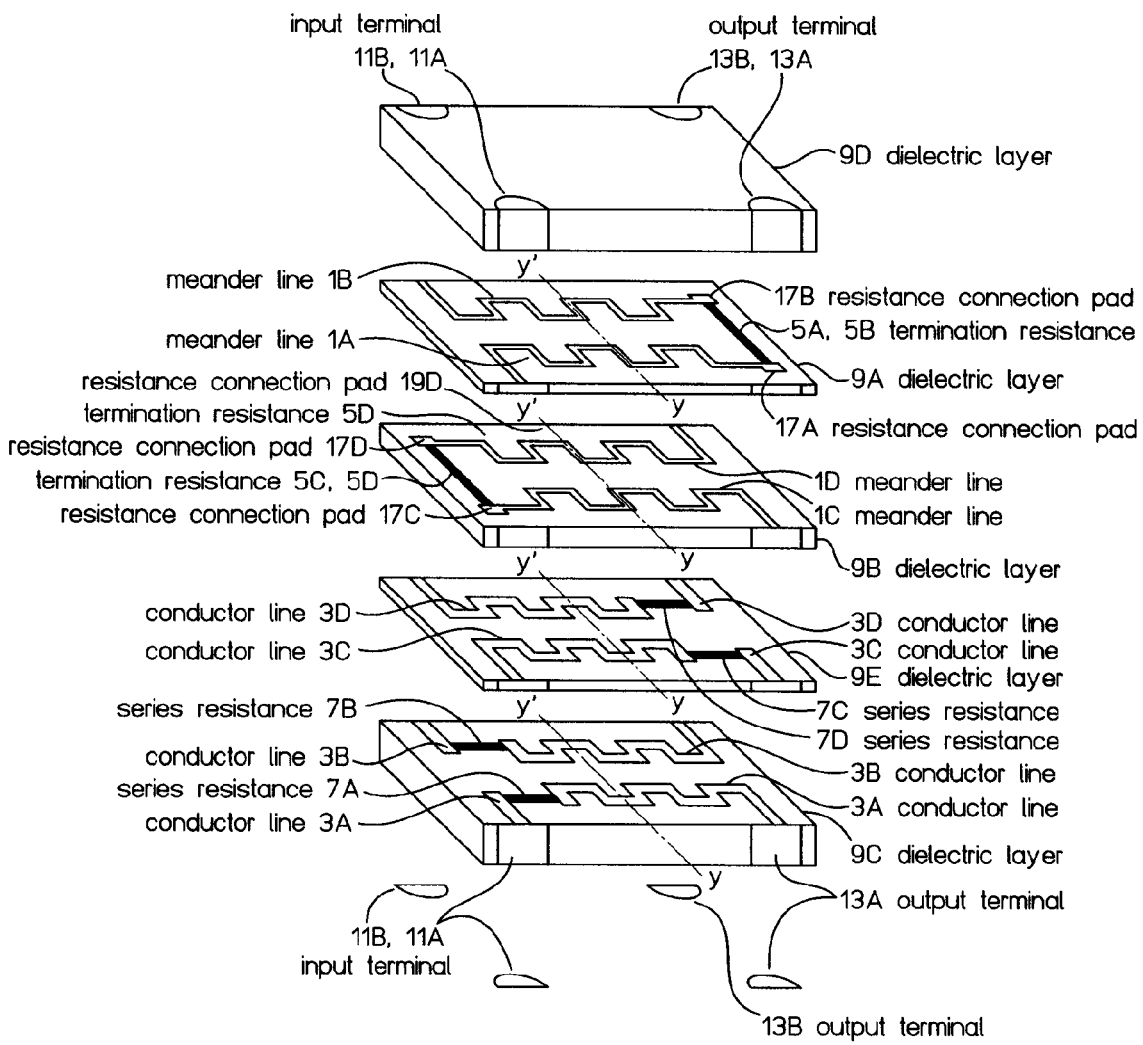
FIG. 14 is an exploded perspective view showing a passive equalizer according to another embodiment of the present invention.

FIG. 14 is an exploded perspective view showing another structure of the passive equalizer E of the present invention, which has a structure for a differential signal only, without ground terminals.

In FIG. 14, ground terminals 15A and 15B, and resistance connection pads 19A to 19D are removed from the structure of FIG. 12.

Thus, since the ground destination of the termination resistances 5A to 5D are eliminated, the termination resistances 5A and 5B are sequentially connected between the resistance connection pads 17A and 17B, and the termination resistances 5C and 5D are also sequentially connected between the resistance connection pads 17C and 17D, so as to be terminated between differential lines. The other structure is the same as the structure of FIG. 1.

Figure 15:
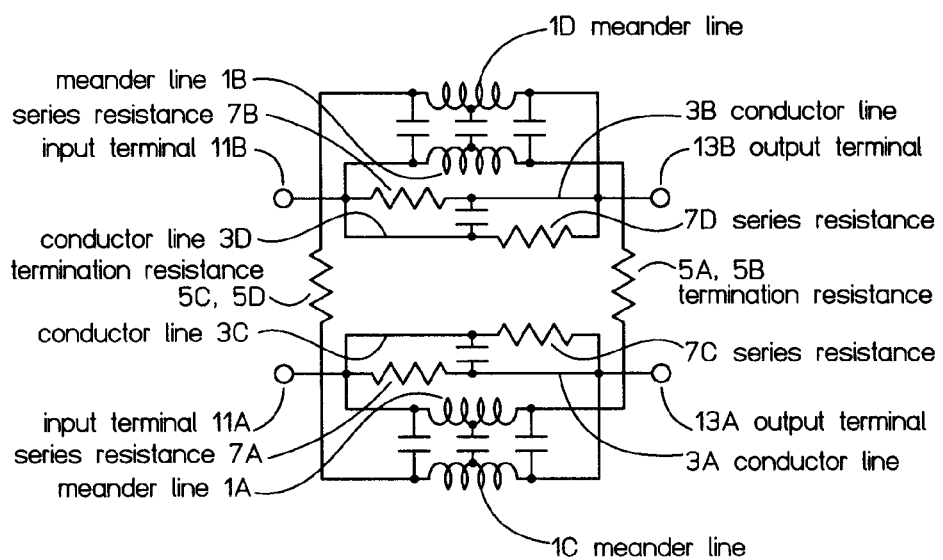
FIG. 15 is an equivalent circuit of the passive equalizer of FIG. 14.

FIG. 15 is an equivalent circuit of FIG. 14. The structure of FIG. 17 is the structure of a differential T-type attenuator in a direct current (DC) manner, and meanwhile the structure of FIG. 14 is the structure of a differential π-type attenuator in a direct current (DC) manner by connecting the termination resistance between a pair of the differential lines as shown in FIG. 15.

Figure 16:
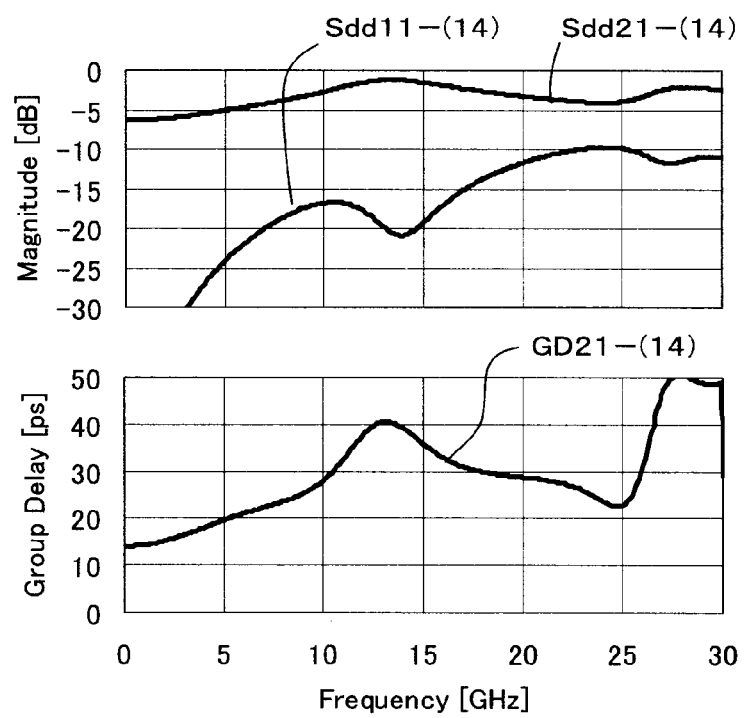
FIG. 16 is a frequency characteristic of the passive equalizer of FIG. 14.

FIG. 16 is a frequency characteristic of the equalizer E shown in FIG. 14. FIG. 16 shows that all of the differential reflection characteristic Sdd11-(14), the differential transmission characteristic SDD21-(14), and the differential group delay characteristic GD21-(14) have the characteristic equal to or higher than the characteristic of other structure.

As described above, explanation is given for the example of the present invention, such that the passive equalizer E is fabricated in a ceramic lamination process. However, the passive equalizer E is not necessarily required to be made of a ceramic material, if it is made of a dielectric substrate, and can be made of an insulating resin substrate such as a printed circuit board, etc.

Further, in the passive equalizer E of the present invention, the section dividing the conductor lines 3A to 3D is not limited to one, and one or more, namely at least one section may be formed, and the series resistances 7A to 7D may be inserted into each dividing section in series.

In the abovementioned embodiment of the present invention, connection pads 17A to 17D, and 19A to 19D are provided at connection parts of any one or all of the termination resistances 5A to 5D and series resistances 7A to 7D. Therefore these resistances can be stably connected.

Further, the structure of the passive equalizer E of the present invention is not limited to the structure as described above in which termination resistances 5A and 5B are formed on the same formation surfaces as the first and third meander lines 1A and 1B, termination resistances 5C and 5D are formed on the same formation surfaces as the second and fourth meander lines 1C and 1D, series resistances 7A and 7B are formed on the same formation surfaces as the first and third conductor lines 3A and 3B, and series resistances 7C and 7D are formed on the same formation surfaces as the second and fourth conductor lines.

It is also acceptable that termination resistances 5A to 5D, and series resistances 7A to 7D are formed on the formation surface of a dielectric layer, etc., different from the first to fourth meander lines 1A to 1D or conductor lines 3A to 3D, and they are connected to each other by via.

Thus, by constituting the termination resistances 5A to 5D and series resistances 7A to 7D by chip resistor and mounting them on a substrate surface by via, exchange to a resistor having an optimal resistance value is enabled while measuring the characteristic as needed.

Incidentally, the passive equalizer E of the present invention can be executed in a single ended transmission line.

Such a single ended transmission structure is considered from a basic structure of the passive equalizer E of the present invention, and it can be considered that the passive equalizer E forming the differential transmission line is configured so that two single ended transmission lines are disposed therein.

That is, the passive equalizer E has the structure including:
the dielectric layer (first dielectric layer) 9A;
the meander line (first meander line) 1A formed on the dielectric layer (first dielectric layer) 9A, with one end as a signal input position and the other end connected to the termination resistance (first termination resistance) 5A;
the meander line (second meander line) 1C formed on the surface facing the meander line 1A interposing the dielectric layer 9A, along the meander line 1A, and so as to face the meander line 1A, with one end as a signal output position positioned on the other end side of the meander line 1A, and the other end connected to the termination resistance (second termination resistance) 5C formed on the surface facing the meander line 1A interposing the dielectric layer 9A;
the conductor line (first conductor line) 3A formed on the formation surface facing the formation surface of the second meander line 1C with a space between them, with one end as a signal input position and the other end as a signal output position, and at least one place divided in the middle; and
the series resistance (first series resistance) 7A connected in series so as to connect the dividing section dividing the conductor line 3A. The abovementioned dielectric layer 9B is not necessarily required.

Such a single end transmission line can be executed by the structure similar to the abovementioned structures of FIG. 1, FIG. 7, FIG. 9, and FIG. 12, and the effect similar to the effect obtained from these structures, can be obtained.

Further, input/output terminals and a chip-shaped single component with ground terminals are used for the explanation in the abovementioned examples of the present invention.

However, not only the structure using the single component only, but also the following structure is acceptable: only the internal structure part of the passive equalizer E from which input/output terminals and ground terminals are removed is assembled into a circuit substrate, or even in a case of the chip-shaped component, the internal structure part of the equalizer E is integrated in a circuit having other function such as a delay line or a common mode filter for example, to obtain one chip component.

Further, the passive equalizer E may be fabricated through not only the ceramic lamination process but also a thin film process, and in this case, the internal structure part can be integrated in a semiconductor.

DESCRIPTION OF SIGNS AND NUMERALS

1A Meander line (first meander line)
1B Meander line (third meander line)
1C Meander line (second meander line)
1D Meander line (fourth meander line)
3A Conductor line (first conductor line)
3B Conductor line (third conductor line)
3C Conductor line (second conductor line)
3D Conductor line (fourth conductor line)
5A Termination resistance (first termination resistance)
5B Termination resistance (third termination resistance)
5C Termination resistance (second termination resistance)
5D Termination resistance (fourth termination resistance)
7A Series resistance (first series resistance)
7B Series resistance (third series resistance)
7C Series resistance (second series resistance)
7D Series resistance (fourth series resistance)
9A Dielectric layer (first dielectric layer)
9B Dielectric layer (third dielectric layer)
9C Dielectric layer (second dielectric layer)
9D Dielectric layer (fourth dielectric layer)
9E Dielectric layer (fifth dielectric layer)
11A, 11B Input terminal
13A, 13B Output terminal
15A, 15B Ground terminal
17A, 17B, 17C, 17D, 19A, 19B, 19C, 19D Resistance connection pad
E Passive equalizer

The invention claimed is:

1. A passive equalizer, comprising:
a first meander line formed on one surface of a dielectric layer, with one end as a signal input position and the other end connected to a first termination resistance;
a second meander line formed on a side facing the first meander line interposing the dielectric layer, along the first meander line so as to face the first meander line, with one end positioned at the other end side of the first meander line as a signal output position and the other end connected to a second termination resistance;
a first conductor line formed on a surface facing a formation surface of the second meander line with a space between them, with one end as the signal input position and the other end as the signal output position, and at least one portion divided in a middle; and
a first series resistance connected in series so as to connect a dividing section dividing the first conductor line.

2. The passive equalizer according to claim 1, wherein the first and second meander lines have a folding cycle in such a manner that a bending line is partially overlapped on a virtual median line crossing a middle part between the signal input position and the signal output position, and the first and second meander lines are formed into the same shape so as to have a line-symmetric relation to each other, with a median line as a center.

3. The passive equalizer according to claim 1, wherein the first conductor line is a meander line.

4. The passive equalizer according to claim 1, comprising:
a second conductor line formed on a formation surface facing the formation surface of the first conductor line with a space between them, along the first conductor line so as to face the first conductor line, with one end as the signal input position and the other end as the signal output position, and at least one portion divided in a middle; and
a second series resistance connected in series so as to connect a dividing section dividing the second conductor line.

5. The passive equalizer according to claim 4, wherein the dividing section dividing the first and second conductor lines is formed at a position mutually away from the median line.

6. The passive equalizer according to claim 4, wherein the second conductor line is a meander line.

7. The passive equalizer according to claim 4, wherein the first and second conductor lines are formed into the same shape so as to have a line-symmetric relation to each other, with a median line as a center.

8. The passive equalizer according to claim 1, comprising:
a third meander line formed in a line-symmetric with respect to the first meander line on the formation surface of the first meander line in the dielectric layer, as a pair of differential transmission lines, with one end as an reverse phase signal input position showing a differential reverse polarity to the signal input position, and the other end connected to one end of a third termination resistance which is formed on the same formation surface as the formation surface of the first termination resistance;
a fourth meander line formed in a line-symmetric with respect to the second meander line on the formation surface of the second meander line, as a pair of differential transmission lines, with one end positioned at the other end side of the third meander line as the reverse phase signal output position, and the other end connected to one end of a fourth termination resistance which is formed on the same formation surface as the formation surface of the second termination resistance;
a third conductor line formed in a line-symmetric with respect to the first conductor line on the same formation surface as the formation surface of the first conductor line, as a pair of differential lines, with one end as the reverse phase signal input position and the other end as the reverse phase signal output position, and at least one portion divided in a middle; and
a third series resistance connected in series so as to connect the dividing section dividing the third conductor line.

9. The passive equalizer according to claim 8, wherein the first and second meander lines have a folding cycle in such a manner that a bending line is partially overlapped on a virtual median line crossing a middle part between the signal input position and the signal output position, and are formed into the same shape so as to have a line-symmetric relation to each other, with a median line as a center.

10. The passive equalizer according to claim 8, wherein the first and third conductor lines are meander lines.

11. The passive equalizer according to claim 8, comprising:

the second conductor line formed on a surface facing the first conductor line, along the first conductor line so as to face the first conductor line, with one end as the signal input position and the other end as the signal output position, and at least one portion divided in a middle;

a second series resistance connected in series so as to connect a dividing section dividing the second conductor line;

a fourth conductor line formed in a line-symmetric with respect to the second conductor line on the same formation surface as the formation surface of the second conductor line, as a pair of differential lines, with one end as the reverse phase signal input position and the other end as the reverse phase signal output position, and at least one portion divided in a middle; and a fourth series resistance connected in series so as to connect the dividing section dividing the fourth conductor line.

12. The passive equalizer according to claim 11, wherein dividing sections dividing the first to fourth conductor lines are formed at positions away from each other from the median line.

13. The passive equalizer according to claim 11, wherein the second and fourth conductor lines are meander lines.

14. The passive equalizer according to claim 11, wherein the first and second conductor lines are formed into the same shape so as to have a line-symmetric relation to each other, with a median line as a center.

* * * * *